United States Patent
Kim

(10) Patent No.: US 10,862,444 B2
(45) Date of Patent: Dec. 8, 2020

(54) AMPLIFICATION DEVICE OF CASCODE STRUCTURE

(71) Applicant: SAMSUNG ELECTRO-MECHANICS CO., LTD., Suwon-si (KR)

(72) Inventor: Jong myeong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/280,882

(22) Filed: Feb. 20, 2019

(65) Prior Publication Data

US 2020/0021259 A1    Jan. 16, 2020

(30) Foreign Application Priority Data

Jul. 10, 2018 (KR) ........................ 10-2018-0080133

(51) Int. Cl.
| | |
|---|---|
| H03F 1/22 | (2006.01) |
| H03F 3/45 | (2006.01) |
| H03F 1/02 | (2006.01) |
| H03F 3/24 | (2006.01) |
| H03F 3/21 | (2006.01) |
| H03F 3/213 | (2006.01) |

(52) U.S. Cl.
CPC ....... *H03F 3/45192* (2013.01); *H03F 1/0277* (2013.01); *H03F 1/223* (2013.01); *H03F 3/211* (2013.01); *H03F 3/213* (2013.01); *H03F 3/24* (2013.01)

(58) Field of Classification Search
CPC .................................... H03F 1/22; H03F 1/30
USPC .......................................... 330/311, 296, 285
See application file for complete search history.

(56) References Cited

U.S. PATENT DOCUMENTS

| | | | | |
|---|---|---|---|---|
| 4,207,592 A | * | 6/1980 | Harwood ................. | H04N 9/72 348/692 |
| 4,460,876 A | * | 7/1984 | Najman ................... | H03G 3/02 330/296 |
| 6,724,259 B2 | * | 4/2004 | Tanabe ..................... | H03F 1/22 330/278 |
| 7,397,309 B2 | * | 7/2008 | Tanoi ...................... | H03F 1/086 330/296 |
| 8,493,154 B1 | * | 7/2013 | Camargo ................. | H03F 1/223 330/296 |
| 8,519,797 B2 | * | 8/2013 | Wang ..................... | H03F 1/0266 330/296 |
| 8,779,859 B2 | * | 7/2014 | Su .......................... | H03F 1/223 330/311 |
| 10,243,519 B2 | * | 3/2019 | Dykstra ................. | H03F 1/3205 |

(Continued)

FOREIGN PATENT DOCUMENTS

| | | |
|---|---|---|
| KR | 10-2015-0097622 A | 8/2015 |
| WO | WO 2014/100491 A1 | 6/2014 |

*Primary Examiner* — Henry Choe
(74) *Attorney, Agent, or Firm* — NSIP Law

(57) ABSTRACT

An amplification device having a cascode structure includes an amplification circuit including a first transistor and a second transistor, cascode-connected to each other and receiving an operating voltage to amplify an input signal; a first bias circuit generating a first bias voltage and supplying the first bias voltage to the first transistor; and a second bias circuit generating a second bias voltage based on a control voltage and the operating voltage and supplying the second bias voltage to the second transistor.

12 Claims, 5 Drawing Sheets

(56) References Cited

U.S. PATENT DOCUMENTS

2004/0227576 A1* 11/2004 Vice .................. H03F 1/0277
                                                    330/285
2015/0249437 A1*  9/2015 Morishita ............ H03F 3/211
                                                    455/253.2
2017/0133989 A1   5/2017 Dykstra et al.

* cited by examiner

AMPLIFICATION DEVICE OF CASCODE STRUCTURE

CROSS-REFERENCE TO RELATED APPLICATION

This application claims the benefit under 35 U.S.C. § 119(a) of Korean Patent Application No. 10-2018-0080133 filed on Jul. 10, 2018 in the Korean Intellectual Property Office, the entire disclosure of which is incorporated herein by reference for all purposes.

BACKGROUND

1. Field

The following description relates to an amplification device having a cascode structure.

2. Description of Background

The latest developed Wi-Fi module for mobile is configured to implement multiple-input multiple-output (MIMO) 2.4 GHz/5 GHz dual band communications.

Since a miniaturized and integrated design suitable for a mobile device is required, a front end (FE) integrated circuit (IC) in which a power amplifier (PA), a coupler, a radio frequency (RF) switch, and a low noise amplifier (LNA) are included in a single chip is required.

In addition, there is a demand for an FEIC that operates stably within a wide supply voltage range from 2.5V to 4.75V (typically, 3.85V, extended 5.25V) in consideration of a battery usage environment of the mobile device. In addition, improvements in linearity characteristics are required.

In a low noise amplifier including first and second transistors connected to each other in a cascode structure, among conventional low noise amplifiers, the first transistor supplies a bias current through a separate bias circuit, and a base of the second transistor receives an operating voltage, a battery voltage, as a bias voltage through a resistor.

However, the conventional amplifier including two transistors of the cascode structure has a problem that in a case in which input power is high, since a base bias current is increased and a collector current is increased, a base current passing through a base resistance is increased and a voltage drop is increased at the base resistance to drop a base voltage, thereby turning off the transistors.

In addition, there is a problem that when the battery voltage drops, the transistors are turned off due to the drop of the base voltage.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an amplification device includes: an amplification circuit including a first transistor and a second transistor, cascode-connected to each other and receiving an operating voltage to amplify an input signal; a first bias circuit generating a first bias voltage and supplying the first bias voltage to the first transistor; and a second bias circuit generating a second bias voltage based on a control voltage and the operating voltage and supplying the second bias voltage to the second transistor.

The amplification device may further include a control circuit receiving the operating voltage and generating the control voltage.

The second bias circuit may vary the second bias voltage based on the control voltage and the operating voltage.

The second bias circuit may include a voltage variable circuit connected between a terminal of the operating voltage and a base of the second transistor to vary the second bias voltage based on the control voltage and the operating voltage; and a capacitor circuit connected between an output terminal of the voltage variable circuit and a ground to stabilize the second bias voltage.

The voltage variable circuit may include a resistor connected between the terminal of the operating voltage and the base of the second transistor; and a switch element connected to the resistor in parallel, turned on or off based on the control voltage and the operating voltage, and providing a current bypass path in a turned-on state.

The control circuit may receive the operating voltage to generate the control voltage having constant magnitude regardless of a change of the operating voltage.

In another general aspect, an amplification device includes: an amplification circuit including a first transistor and a second transistor, cascode-connected to each other and receiving an operating voltage to amplify an input signal; a first bias circuit generating a first bias voltage based on an amplitude of the input signal and supplying the first bias voltage to the first transistor; and a second bias circuit generating a second bias voltage based on the operating voltage control voltage input at the time of receiving the operating voltage and supplying the second bias voltage to the second transistor.

The amplification device may further include a control circuit receiving the operating voltage and generating the control voltage based on the operating voltage.

The second bias circuit may vary the second bias voltage based on the control voltage and the operating voltage.

The second bias circuit may include a voltage variable circuit connected between a terminal of the operating voltage and a base of the second transistor to vary the second bias voltage based on the control voltage and the operating voltage; and a capacitor circuit connected between an output terminal of the voltage variable circuit and a ground to stabilize the second bias voltage.

The voltage variable circuit may include a diode-connected bipolar junction transistor (BJT) transistor connected between the terminal of the operating voltage and the base of the second transistor; and a switch element connected in parallel to the diode-connected BJT transistor, turned on or off based on the control voltage and the operating voltage, and providing a current bypass path in a turned-on state.

The control circuit may receive the operating voltage to generate the control voltage having constant magnitude regardless of a change of the operating voltage.

In another general aspect, an amplification device includes: a first transistor; a second transistor cascode-connected to the first transistor; and a bias circuit to generate a bias voltage based on a control voltage and an operating voltage and to supply the bias voltage to the second transistor. The bias circuit includes a switch element to be turned on in a case in which a voltage difference between the control voltage and the bias voltage is greater than or equal to a turn-on voltage, so that the operating voltage is applied to a base of the second transistor through the switch element.

The amplification device may include a resistor connected in parallel to the switch element.

The amplification device may include a third transistor connected in parallel to the switch element.

The third transistor may be a diode-connected bipolar junction transistor (BJT) transistor.

The amplification may include a voltage regulator to receive the operating voltage and to generate the control voltage based on the operating voltage.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
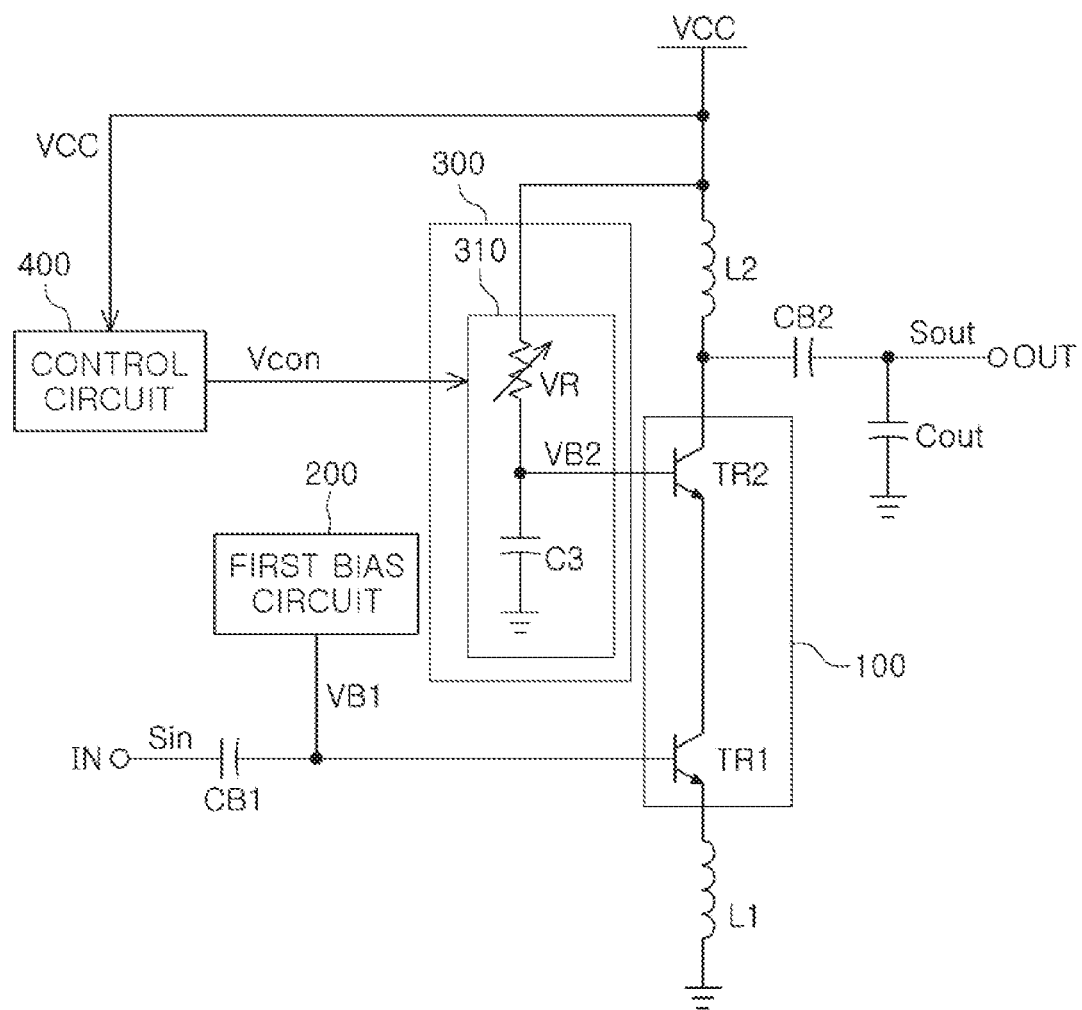
FIG. 1 is a first block diagram illustrating an amplification device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

FIG. 1 is a first block diagram illustrating an amplification device according to an example.

Referring to FIG. 1, an amplification device may include an amplification circuit 100, a first bias circuit 200, a second bias circuit 300, and a control circuit 400.

The amplification circuit 100 may include a first transistor TR1 and a second transistor TR2, which are cascode-connected to each other, and may be supplied with an operating voltage VCC to amplify an input signal Sin. As an example, the operating voltage VCC may be a battery voltage.

An emitter of the first transistor TR1 may be connected to a ground through a first inductor L1, a collector of the first transistor TR1 may be connected to an emitter of the second transistor TR2, and a base of the first transistor TR1 may be connected to an input terminal IN through a first capacitor CB1. An output capacitor Cout may be connected between an output terminal OUT and the ground to stabilize an output voltage. As an example, the first inductor L1 may be a degeneration inductor and a second inductor L2 may be a chock inductor. Here, each of the first inductor L1, the second inductor L2, the first capacitor CB1, and the output capacitor Cout is merely one example, and may be omitted or replaced with other impedance matching elements, and is not thus limited to that the configuration illustrated in the drawings.

A collector of the second transistor TR2 may be connected to an operating voltage VCC terminal through the second inductor L2 and may be connected to the output terminal OUT through a second capacitor CB2, and a base of the second transistor TR2 may receive a second bias voltage VB2 output from the second bias circuit 300.

For example, the first bias circuit 200 may generate a first bias voltage VB1 regardless of amplitude of the input signal Sin, which is input through the input terminal IN. As an example, the first bias circuit 200 may generate the first bias voltage VB1 according to the amplitude of the input signal Sin which is input through the input terminal IN and may supply the first bias voltage VB1 to the first transistor TR1. As an example, the first bias circuit 200 may include a circuit detecting a size of the input terminal IN, or may receive a size signal corresponding to the size of the input terminal IN from the outside.

The second bias circuit 300 may generate the second bias voltage VB2 according to a control voltage Vcon and the operating voltage VCC and may provide the second bias voltage VB2 to the second transistor TR2. For example, the second bias circuit 300 may vary the second bias voltage VB2 according to the control voltage Vcon and the operating voltage VCC. As an example, the second bias circuit 300 may vary the second bias voltage VB2 according to a magnitude of the operating voltage VCC. This will be described below.

The control circuit 400 may be supplied with the operating voltage VCC and generate the control voltage Vcon. As an example, the control circuit 400 may output the control voltage Vcon that always has a constant magnitude regardless of a change of the operating voltage VCC. As an example, as the control circuit 400, a voltage regulator such as low drop out (LDO) capable of supplying a constant voltage regardless of the change of the operating voltage may be employed.

In the respective drawings, an unnecessary overlapping description for components denoted by the same reference numerals and having the same functions will be omitted, and contents different from each other will be described in the respective drawings.

Figure 2:
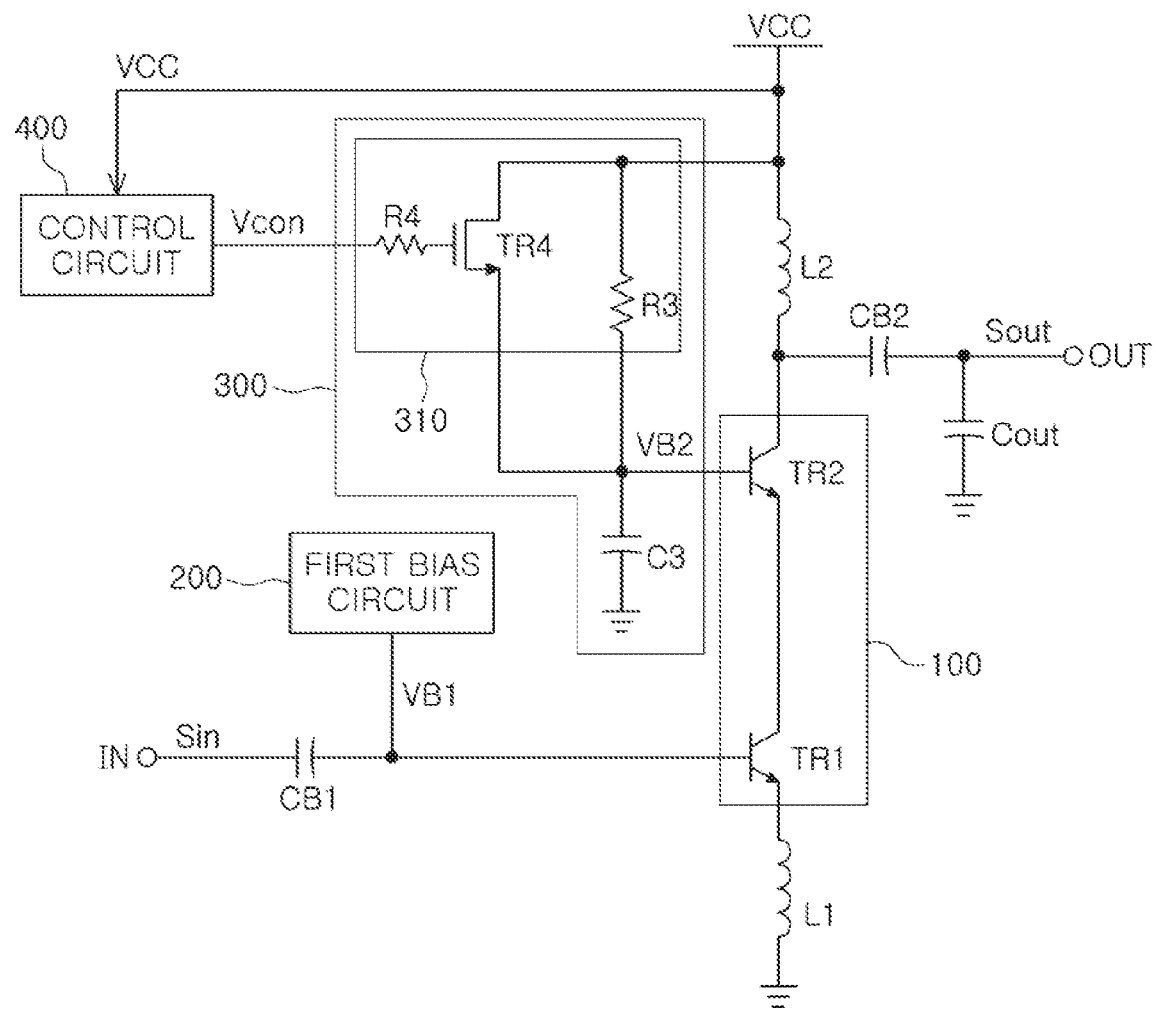
FIG. 2 is a diagram illustrating an implementation of the amplification device of FIG. 1.

FIG. 2 is a diagram illustrating an implementation of the amplification device of FIG. 1.

Referring to FIGS. 1 and 2, the second bias circuit 300 may include a voltage variable circuit 310 and a capacitor circuit C3.

The voltage variable circuit 310 may be connected between the terminal of the operating voltage VCC and the base of the second transistor TR2 to vary the second bias voltage VB2 according to the control voltage Vcon and the operating voltage VCC.

The capacitor circuit C3 may be connected between an output terminal of the voltage variable circuit 310 and the ground to stabilize the second bias voltage VB2.

For example, the voltage variable circuit 310 may include a resistor R3 and a switch element TR4.

The resistor R3 may be connected between the terminal of the operating voltage VCC and the base of the second transistor TR2. In a state in which the switch element TR4 is turned off, the second bias voltage VB2 may be dropped by the resistor R3 as much as a voltage determined according to a current flowing through the resistor R3 and a resistance value of the resistor R3.

The switch element TR4 may be connected to the resistor in parallel R3 and may be turned on or off according to the control voltage Vcon and the operating voltage VCC. When the switch element TR4 is turned on, the switch element TR4 may provide a current bypass path.

As an example, the switch element TR4 may be a metal oxide semiconductor (MOS) transistor including a drain connected to one end of the resistor R3, a source connected to the other end of the resistor R3, and a gate receiving the control voltage Vcon through the resistor R3.

For example, the switch element TR4 may be turned on or off according to the control voltage Vcon and the operating voltage VCC. When the switch element TR4 is turned on, the switch element TR4 may provide the current bypass path. For example, when the switch element TR4 is turned off, the voltage drop may occur by the resistor R3. Therefore, a voltage lower than the operating voltage VCC by a voltage dropped by the resistor R3 may be applied to the base of the second transistor TR2.

As an example, in a case in which the operating voltage VCC is the battery voltage, when the battery voltage is lowered, the second bias voltage (VB2=VCC−VR3) may be lowered by a voltage VR3 dropped by the resistor R3. Therefore, when a difference voltage between the control voltage Vcon and the second bias voltage VB2 is a turn-on voltage or more, the switch element TR4 may be turned on. As described above, when the switch element TR4 is turned on, the operating voltage VCC may be applied to the base of the second transistor TR2 through the switch element TR4.

Accordingly, a problem that the second transistor TR2 of the amplification circuit 100 is turned off due to a low battery voltage may be prevented.

Figure 3:
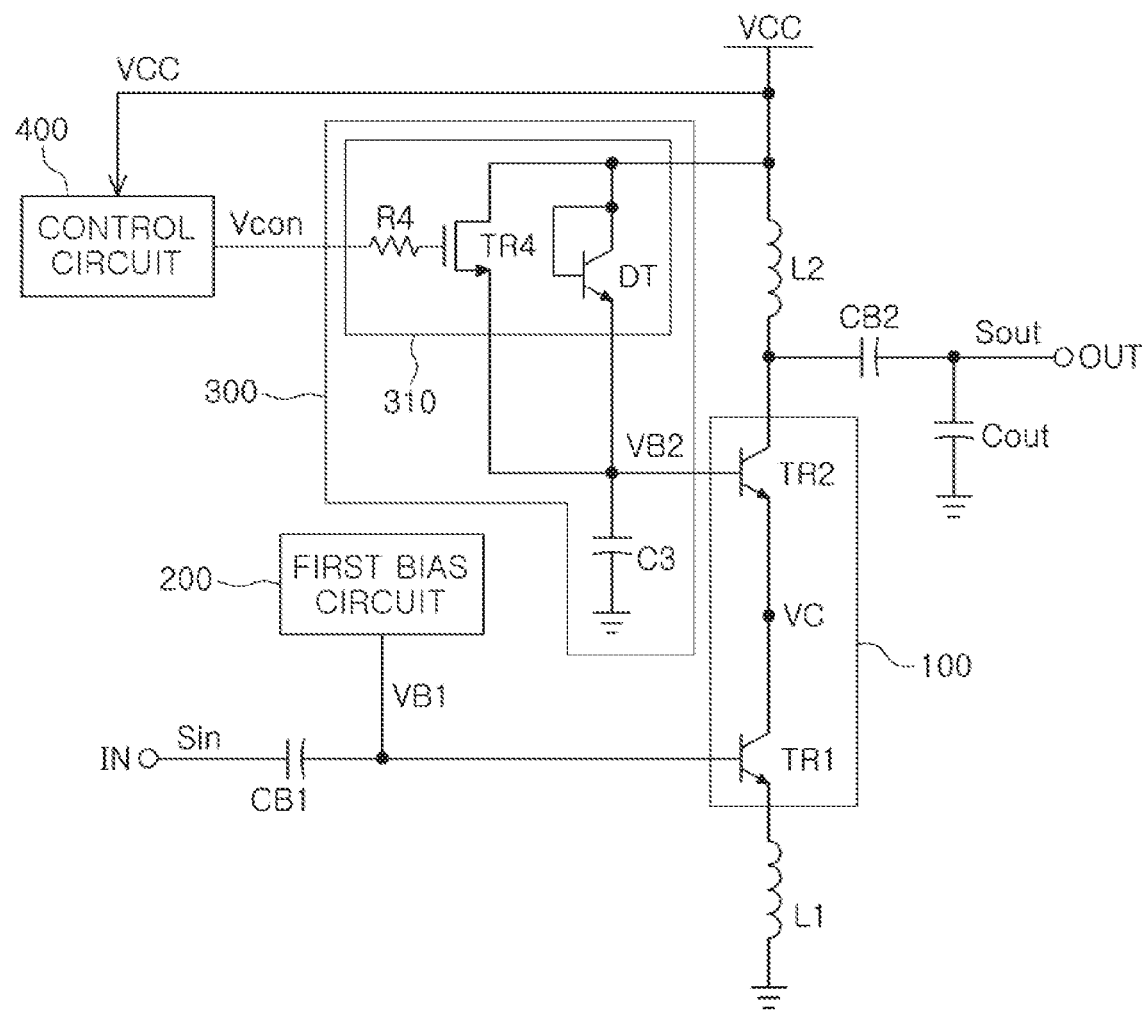
FIG. 3 is a diagram illustrating an implementation of the amplification device of FIG. 1.

FIG. 3 is a diagram illustrating an implementation of the amplification device of FIG. 1.

Referring to FIGS. 1 and 3, the second bias circuit 300 may include the voltage variable circuit 310 and the capacitor circuit C3.

The voltage variable circuit 310 may be connected between the terminal of the operating voltage VCC and the base of the second transistor TR2 to generate the second bias voltage VB2 according to the control voltage Vcon and the operating voltage VCC.

The capacitor circuit C3 may include at least one capacitor connected between the output terminal of the voltage variable circuit 310 and the ground and may stabilize the second bias voltage VB2.

For example, the voltage variable circuit 310 may include a diode-connected bipolar junction transistor (BJT) transistor DT and the switch element TR4.

The diode-connected BJT transistor DT may include a base and a collector that are connected to the terminal of the operating voltage VCC, and an emitter connected to the base of the second transistor TR2. The switch element TR4 may be connected in parallel to the diode-connected BJT transistor DT and may be a MOS transistor including a drain connected to a collector of the diode-connected BJT transistor DT, a source connected to an emitter of the diode-connected BJT transistor DT, and a gate receiving the control voltage Vcon through the resistor R3.

The switch element TR4 may be turned on or off according to the control voltage Vcon and the operating voltage VCC. For example, in the case in which the switch element TR4 is turned off, since the diode-connected BJT transistor DT provides a constant voltage, a voltage lower than the operating voltage VCC by the constant voltage may be applied to the base of the second transistor TR2. When the diode-connected BJT transistor DT is applied, the variation of the second bias voltage VB2 generated when the amplitude of the input signal is increased may be prevented.

As another example, in a case in which the operating voltage VCC is the battery voltage, when the battery voltage is lowered, the second bias voltage (VB2=VCC-VR3) may be lowered by the voltage VR3 dropped by the resistor R3. Therefore, when a difference voltage between the control voltage Vcon and the second bias voltage VB2 is a turn-on voltage or more, the switch element TR4 may be turned on. As described above, when the switch element TR4 is turned on, the operating voltage VCC may be applied to the base of the second transistor TR2 through the switch element TR4.

Accordingly, a problem that the second transistor TR2 of the amplification circuit 100 is turned off due to a low battery voltage may be prevented.

Figure 4:
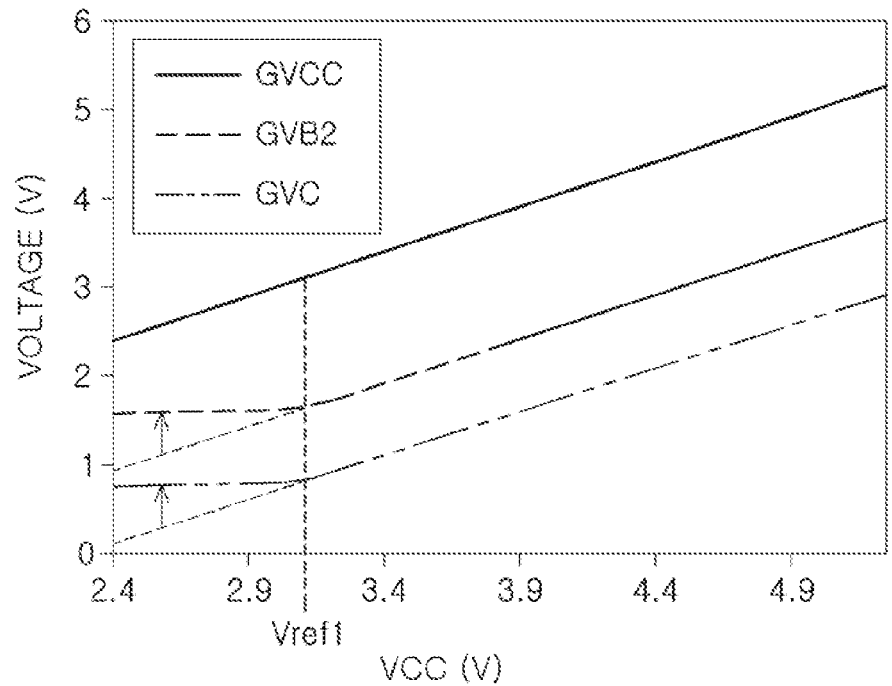
FIG. 4 is a voltage graph by a second bias circuit of FIG. 3.

FIG. 4 is a voltage graph by a second bias circuit of FIG. 3. In FIG. 4, GVCC is a graph of the operating voltage VCC, GVB2 is a graph of the second bias voltage VB2, and GVC is a graph of a collector voltage VC of the first transistor TR1.

GVB2 and GVC illustrated in FIG. 4 show voltage change graphs according to a change in VCC. When the operating voltage VCC is decreased to a reference voltage Vref1 or less, the control voltage Vcon may have a high level and the switch element TR4 may be turned on by the control voltage Vcon such that the operating voltage VCC is directly transferred to the base of the second transistor TR2 through the switch element TR4. Therefore, a drop of a base voltage of the second transistor TR2 to a specific voltage or less may be prevented.

Accordingly, since the base voltage VB2 of the second transistor and the collector voltage VC of the first transistor may be maintained at a constant level without being further dropped at the operating voltage VCC lower than the reference voltage Vref1, the first transistor TR1 may operate in a saturation region even at the operating voltage VCC lower than the reference voltage Vref1.

Figure 5:
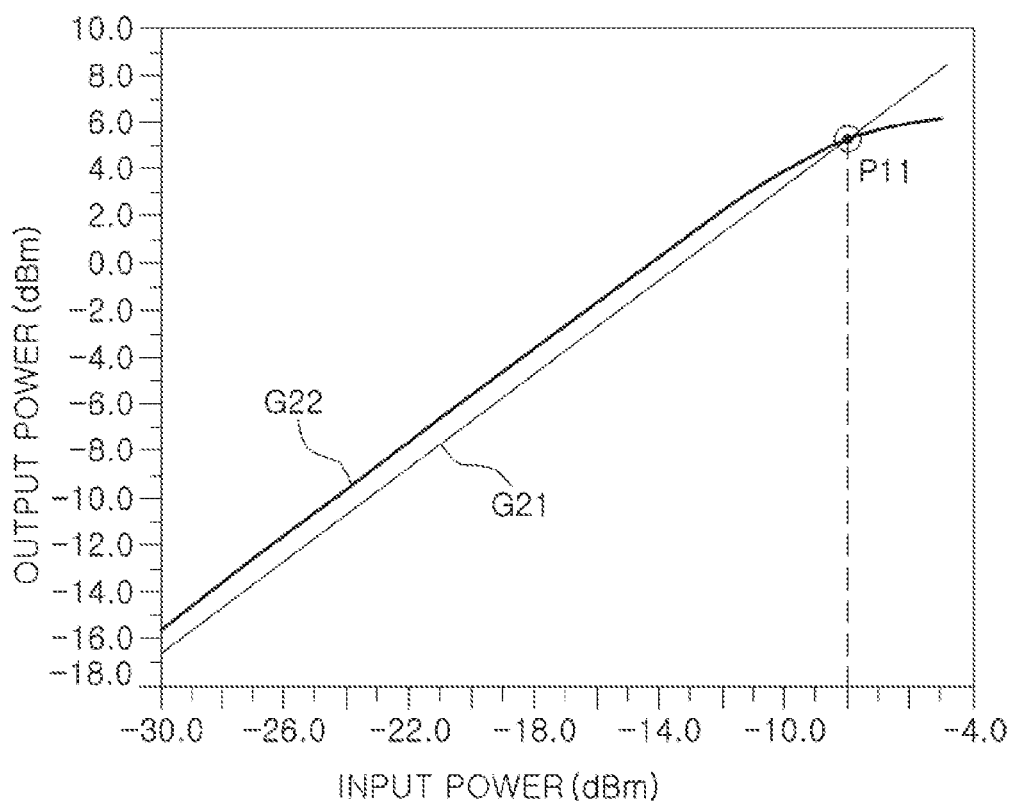
FIG. 5 is an input P1$d$B graph of a conventional amplification device.
Figure 6:
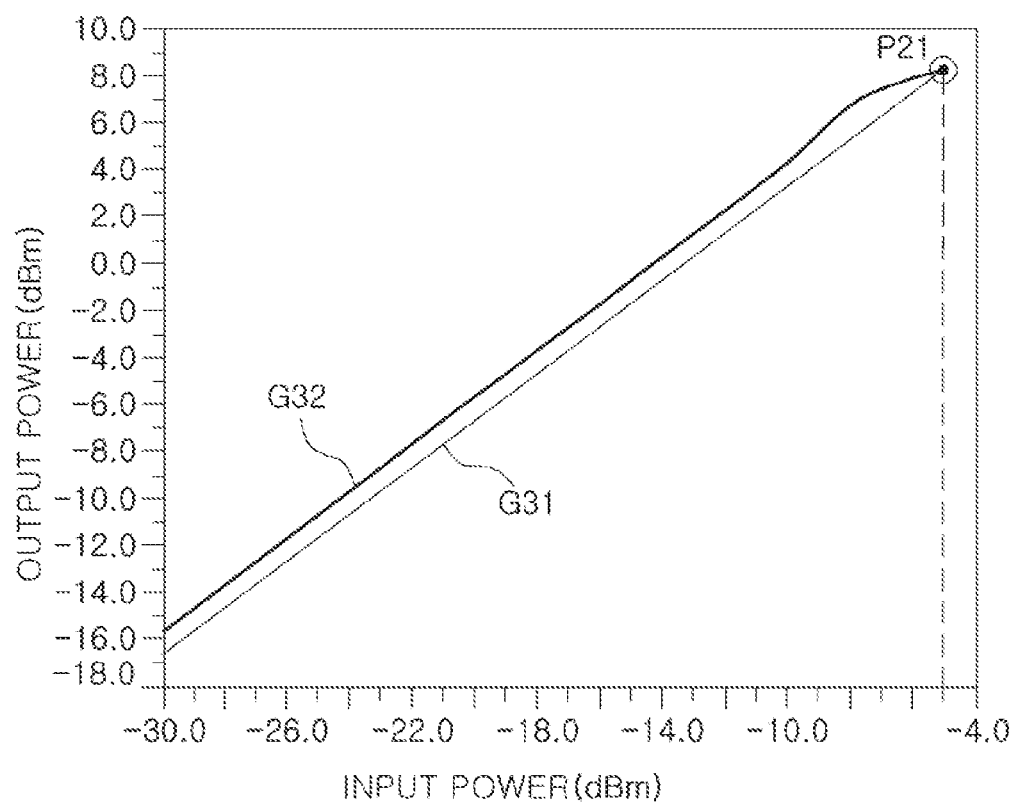
FIG. 6 is an input P1$d$B graph of an amplification device according to an example.

FIG. 5 is an input P1$d$B graph of a conventional amplification device and FIG. 6 is an input P1$d$B graph of an amplification device consistent with the examples disclosed herein.

In FIG. 5, G21 is an ideal relationship graph between input power and output power, G22 is a measurement relationship graph between input power and output power of the conventional amplification device, and P11 is input P1$d$B. In FIG. 6, G31 is an ideal relationship graph between input power and output power, G32 is a measurement relationship graph between input power and output power of the amplification device according to examples consistent with the present disclosure, and P11 is input P1$d$B.

Here, P1$d$B, which is an index showing linearity, is an output power graph according to an input power increase, and means a point at which the output power increases as the input power increases and then decreases by 1 dB.

Referring to G21, G22, and P11 of FIG. 5, the input P1$d$B of the conventional amplification device is approximately −8.2 [dBm]. Referring to G31, G32, and P21 of FIG. 6, P1$d$B of the amplification device according to examples disclosed herein is approximately −5.0 [dBm]. Referring to those described above, it may be seen that the amplification device according to examples disclosed herein shows better P1$d$B characteristics.

As set forth above, even in the case of the drop of the battery voltage or the high input power, since the transistor of the cascode structure may perform more stable operation, linearity of the low noise amplification device may be improved.

The examples disclosed herein may provide an amplification device having a cascode structure capable of performing a stable operation in the case of a drop of a battery voltage or high input power.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplification device comprising:
    an amplification circuit comprising a first transistor and a second transistor, cascode-connected to each other and configured to receive an operating voltage to amplify an input signal;
    a first bias circuit configured to generate a first bias voltage and to supply the first bias voltage to the first transistor;
    a second bias circuit configured to generate and to vary a second bias voltage based on a control voltage and the operating voltage and to supply the second bias voltage to the second transistor; and
    a control circuit configured to receive the operating voltage and to generate the control voltage such that the control voltage has a constant magnitude regardless of a change of the operating voltage.

2. The amplification device of claim 1, wherein the second bias circuit comprises:
    a voltage variable circuit connected between a terminal of the operating voltage and a base of the second transistor, and configured to vary the second bias voltage based on the control voltage and the operating voltage; and
    a capacitor circuit connected between an output terminal of the voltage variable circuit and a ground, and configured to stabilize the second bias voltage.

3. The amplification device of claim 2, wherein the voltage variable circuit comprises:

a resistor connected between the terminal of the operating voltage and the base of the second transistor; and a switch element connected to the resistor in parallel, and configured to be turned on or off based on the control voltage and the operating voltage and to provide a current bypass path in a turned-on state.

4. An amplification device comprising:

an amplification circuit comprising a first transistor and a second transistor, cascode-connected to each other and configured to receive an operating voltage to amplify an input signal;

a first bias circuit configured to generate a first bias voltage based on an amplitude of the input signal and to supply the first bias voltage to the first transistor;

a second bias circuit configured to generate and to vary a second bias voltage based on the operating voltage and a control voltage input at a time of receiving the operating voltage, and to supply the second bias voltage to the second transistor; and a control circuit configured to receive the operating voltage and to generate the control voltage based on the operating voltage such that the control voltage has a constant magnitude regardless of a change of the operating voltage.

5. The amplification device having a cascode structure of claim 4, wherein the second bias circuit comprises:

a voltage variable circuit connected between a terminal of the operating voltage and a base of the second transistor, and configured to vary the second bias voltage based on the control voltage and the operating voltage; and a capacitor circuit connected between an output terminal of the voltage variable circuit and a ground, and configured to stabilize the second bias voltage.

6. The amplification device of claim 5, wherein the voltage variable circuit comprises:

a diode-connected bipolar junction transistor (BJT) transistor connected between the terminal of the operating voltage and the base of the second transistor; and a switch element connected in parallel to the diode-connected BJT transistor, and configured to be turned on or off based on the control voltage and the operating voltage and to provide a current bypass path in a turned-on state.

7. An amplification device comprising:

a first transistor;

a second transistor cascode-connected to the first transistor;

a bias circuit configured to generate a bias voltage based on a control voltage and an operating voltage and to supply the bias voltage to the second transistor, the bias circuit comprising a switch element configured to be turned on in a case in which a voltage difference between the control voltage and the bias voltage is greater than or equal to a turn-on voltage, so that the operating voltage is applied to a base of the second transistor through the switch element.

8. The amplification device of claim 7, further comprising a resistor connected in parallel to the switch element.

9. The amplification device of claim 7, further comprising a third transistor connected in parallel to the switch element.

10. The amplification device of claim 9, wherein the third transistor is a diode-connected bipolar junction transistor (BJT) transistor.

11. The amplification device of claim 7, further comprising a voltage regulator configured to receive the operating voltage and to generate the control voltage based on the operating voltage.

12. The amplification device of claim 1, wherein the second bias circuit is configured to generate the second bias voltage based on a magnitude of the operating voltage.

* * * * *